United States Patent
Stasiak et al.

(10) Patent No.: US 11,152,378 B1
(45) Date of Patent: Oct. 19, 2021

(54) REDUCING ERROR RATES WITH ALPHA PARTICLE PROTECTION

(71) Applicant: International Business Machines Corporation, Armonk, NY (US)

(72) Inventors: Daniel L. Stasiak, Austin, TX (US); Hassan Naser, Austin, TX (US); Michael J. Mueller, Leonberg (DE); Kenneth P. Rodbell, Sandy Hook, CT (US); Philip J. Oldiges, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 16/829,414

(22) Filed: Mar. 25, 2020

(51) Int. Cl.
*H01L 27/11* (2006.01)
*H01L 27/28* (2006.01)

(52) U.S. Cl.
CPC ...... *H01L 27/1104* (2013.01); *H01L 27/1112* (2013.01); *H01L 27/285* (2013.01)

(58) Field of Classification Search
None
See application file for complete search history.

(56) References Cited

U.S. PATENT DOCUMENTS

| | | |
|---|---|---|
| 5,990,564 A | 11/1999 | Degani et al. |
| 6,144,103 A | 11/2000 | Miller et al. |
| 6,894,390 B2 | 5/2005 | Schammler et al. |
| 7,451,418 B2 | 11/2008 | Porter et al. |
| 8,692,381 B1 | 4/2014 | Hart |
| 10,191,099 B2 | 1/2019 | Lee et al. |
| 10,319,870 B2 * | 6/2019 | Clevenger ............ G02B 26/007 |
| 2018/0350725 A1 * | 12/2018 | Tuominen ........... H01L 25/0657 |
| 2019/0393163 A1 * | 12/2019 | Park ...................... H01L 23/053 |
| 2020/0185346 A1 * | 6/2020 | Venkatadri .............. H01L 24/05 |

FOREIGN PATENT DOCUMENTS

EP    547989 A2    6/1993

OTHER PUBLICATIONS

Tian et al, "TSV Technology and High-Energy Heavy Ions Radiation Impact Review" Electronics 7.7 MDPI AG. (Jul. 2018) doi:10.3390/electronics7070112, 29 pages.

* cited by examiner

*Primary Examiner* — Steven M Christopher
(74) *Attorney, Agent, or Firm* — Patterson + Sheridan, LLP

(57) ABSTRACT

An integrated circuit package with a buffer providing radiation protection to memory elements and components is described. The integrated circuit packages and the incorporated buffers provide a protective distance between potential sources of internal radiation particles within the integrated circuit package and any memory elements/components which may be sensitive to radiation such as alpha particles. This protective distance allows for the integrated circuit packages to be completed or assembled without needing added more expensive or redundant memory components.

20 Claims, 4 Drawing Sheets

REDUCING ERROR RATES WITH ALPHA PARTICLE PROTECTION

BACKGROUND

The present invention relates to integrated circuit packages, and more specifically, to flip chip or controller collapse chip connection (C4) devices which are interconnected and bonded together using various radiation emitting materials.

The radiation emitting materials, such as lead and lead alloys, can cause memory malfunctions and errors in the electronic circuits and other components in the integrated circuit packages. Protection against radiation from external sources is accomplished through shielding and other various protection mechanisms, but protection against radiation from radioactive source within an integrated circuit package remains challenging.

SUMMARY

One example embodiment includes an integrated circuit package. The integrated circuit package includes a solder layer disposed on a package substrate, where the solder layer may include at least one radiation emitting component. The integrated circuit package also includes a semiconductor buffer layer disposed on the solder layer, where the semiconductor buffer layer may include at least one electrical connection path formed in the semiconductor buffer layer. The integrated circuit package also includes a memory layer disposed on the semiconductor buffer layer, where the memory layer may include at least one memory component, where the semiconductor buffer layer provides radiation protection for the at least one memory component.

One example embodiment includes a radiation buffer for an integrated circuit package. The radiation buffer includes a semiconductor buffer disposed between a radiation emitting component of an integrated circuit package and a radiation sensitive component of the integrated circuit package. The semiconductor buffer may include at least one electrical connection path formed in the semiconductor buffer, where the at least one electrical connection path provides an electrical connection between the radiation emitting component and the radiation sensitive component.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method for manufacturing an integrated circuit package with radiation protection. The method includes providing a first semiconductor layer; forming at least one electrical connection path through the first semiconductor layer; forming a memory layer on a first surface of the first semiconductor layer, where at least one component in the memory layer is electrically connected to the at least one electrical connection path; and affixing a second surface of the first semiconductor layer a solder layer disposed on a package substrate, where the solder layer may include at least one radiation emitting component, and where the first semiconductor layer provides a radiation protection for the at least one component in the memory layer. Other embodiments of this aspect include corresponding computer systems, apparatus, and computer programs recorded on one or more computer storage devices, each configured to perform the actions of the methods.

DETAILED DESCRIPTION

Figure 1:
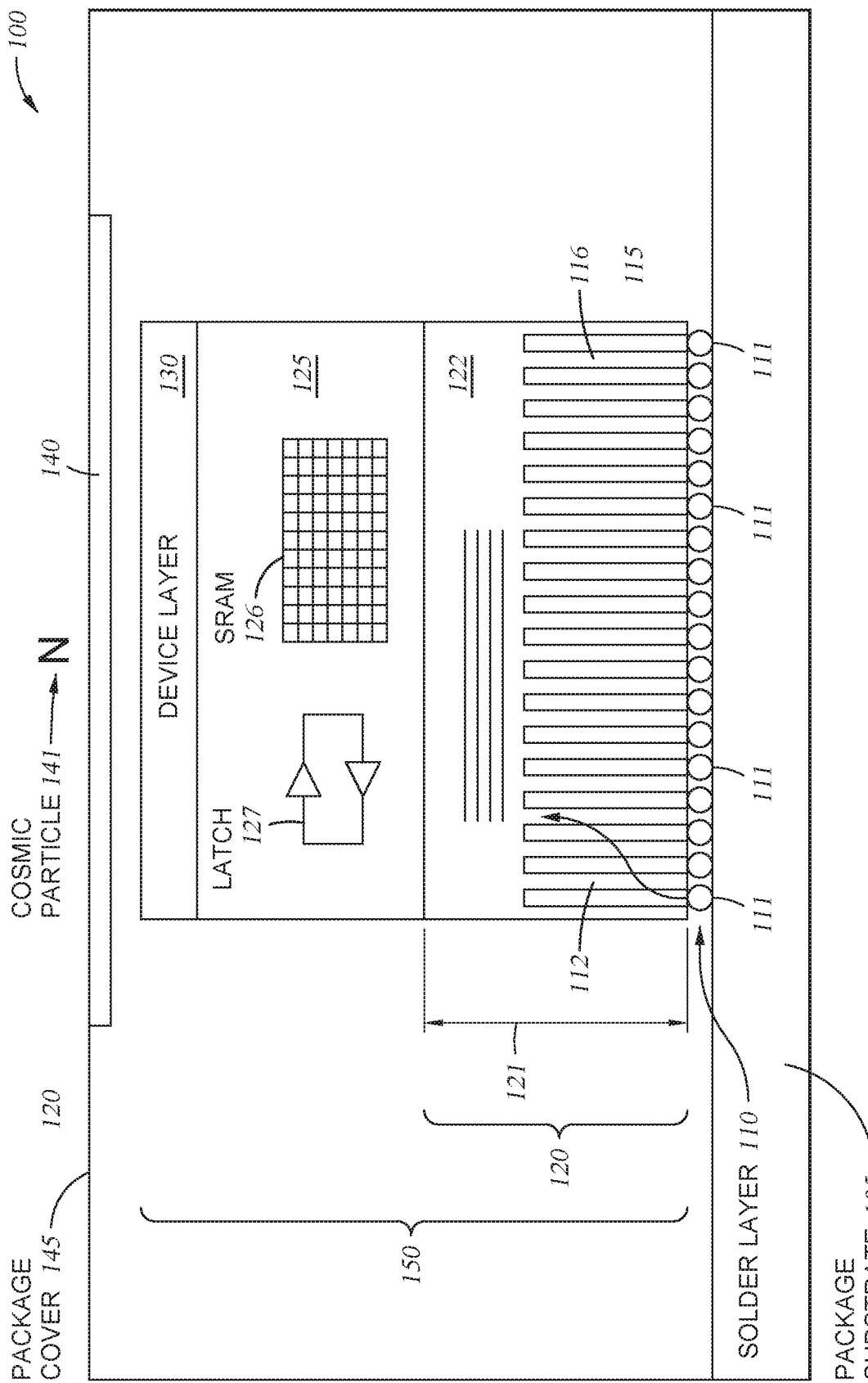
FIG. 1 illustrates an example integrated circuit package, according to one embodiment.

Various integrated circuits and flip chips such as very large-scale integration (VLSI) chips contain memory elements which hold and store electronic values (e.g., hold/store values from one clock cycle to a next clock cycle during the function/use of the integrated circuit package). These memory elements and components may include latches, flip flops, memory cells, register files, content-addressable memory (CAMs), among other memory element and storage types. In some cases, the saved or stored values in the memory elements can be corrupted when a sub-atomic particle such as a cosmic neutron or an alpha particle hits or otherwise interacts with the associated transistors of the memory element. For example, the energy from an interacting particle causes a memory element value change, which in turn causes a soft error in the memory element (i.e., the saved value is wrong). When the altered memory element is read, the circuit and the larger chip or package will not function as intended producing a soft error.

There are many options to prevent memory errors caused by particles originating outside of an integrated circuit package or flip chip. For example, soft errors from cosmic particles have been reduced or prevented by providing shielding around the radiation sensitive areas of the devices. This shielding can be provided anywhere in the system from the chip package to a larger system case. However, this shielding is primarily effective in shielding from external particle or radiation sources.

Various methods and approaches have also been implemented to address soft errors caused by internal sources. For example, error-correcting code (ECC) bits can be added to memory arrays in integrated circuit packages to provide ECC memory data storage, where the ECC bits are used to detect and correct soft errors. In some examples, latches are also "hardened" against soft errors by increasing the transistor sizes of the latch devices, which helps prevent the interacting radiation particles from causing the latch to flip when hit with a sub-atomic particle.

In some examples, saved values in the various memory components are also duplicated or triplicated in one or more redundant memory devices to detect and correct if one version of the saved value is a soft error. However, each of these solutions to the internal radiation problem add area to the integrated circuit packages and increase the power requirements of the chip. In contrast, industrial and standard requirements for integrated circuit packages aim for reduced power consumption and increasingly smaller integrated circuit packages so that the packages can be used in newer and smaller technologies such as mobile devices and internet-of-things devices. While not being ideally suited for cheap and small integrated circuits, the above described mechanisms also increase the cost and complexity of manufacturing the integrated circuit packages due to the increased size and added components.

The integrated circuit packages and buffers described herein provide radiation protection to memory elements/components in integrated circuit packages by providing a protective distance between potential sources of internal radiation particles within the integrated circuit package and any memory elements/components which may be sensitive to radiation such as alpha particles. This protective distance allows for the integrated circuit packages to be completed/assembled without needing added more expensive or redundant memory components.

FIG. 1 illustrates an example integrated circuit package, package 100, according to one embodiment. The ICP 100 includes a package substrate 105. The package substrate 105 is any package substrate material that may provide electrical and/or other signal connectivity to and from an external source to the package 100, such as connections to external electrical circuitry or device. In some examples, the package 100 is a flip-chip or controller collapse chip connection (C4) package. The package 100 includes a package cover 145 and a shield 140 integrated into the package cover 145 or disposed on the package cover 145. The package cover 145 provides protection to the various components in the package 100 from environmental conditions and contaminants that may disrupt the function of the package 100.

The shield 140 provides external radiation protection from sources of radiation that are external from the package 100. For example, the shield 140 prevents radiation from cosmic rays in the form a cosmic particle 141 from entering the package 100 and disrupting the function of the various electronic and other components of the package 100. For example, the shield 140 prevents the cosmic particle 141 from interacting with memory components in the package 100 and causing a single-event upset (SEU) or soft-error in the various memory components of the package 100 discussed herein.

The package 100 also includes a chip 150 bonded to the package substrate 105 via a solder layer 110. The solder layer 110 includes at least one radiation emitting components such as the one or more solder bumps 111, where the solder in the solder bumps 111 act as the bonding agent that connects a wafer/chip pad to a package or board. The solder bumps 111 may be any form of solder, such as C4 balls, to bond the chip 150 to the package substrate 105. The solder material in the solder bumps 111 include various metal alloys including lead, tin, and various alloy mixtures (e.g., lead alloys, tin alloys, etc.) which emit radiation such as alpha particles, e.g., alpha particle radiation. For example, an alpha particle 112 from the solder material may emit from any of the solder bumps 111 and can cause memory errors such as a soft error as described herein.

The chip 150 includes several layers forming the chip 150 including a semiconductor buffer layer 115, a metal layer 122, a memory layer 125, and a device layer 130. The memory layer 125 includes memory components such as a static random-access memory (SRAM) 126 and a latch 127. The memory layer 125 may also include other types of memory storage, memory cells, electronic circuits, transistors, devices, other electronic components, and hardware.

The various components of the memory layer 125 are vulnerable to soft errors caused by radiation including cosmic rays and radioactive decay. As discussed above, the shield 140 provides protection against the cosmic rays such as the cosmic particle 141. The shield 140 does not provide protection to the memory layer 125 from radioactive decay that may occur within the package 100. For example, in the event that the alpha particle 112 interacts with a memory component in the memory layer 125, such as the latch 127, the alpha particle 112 can cause disruption in the latch or the SRAM 126 and result in a soft-error in the package 100.

To prevent soft-errors and other potential disruption to the various components in the package 100 and the chip 150 includes a buffer layer 120 disposed between the solder layer 110 and the memory layer 125. The buffer layer 120 provides an insulating distance 121 between the memory layer 125 and the solder layer 110. The insulating distance 121 provides a sufficient distance between the solder layer 110 and at least the memory layer 125 (or the memory components of the memory layer 125) to prevent alpha particles emitted from the solder bumps 111 from interacting with and/or causing errors in the memory components (e.g., the latch 127 and SRAM 126) in the memory layer 125. In some examples, the alpha particle 112 loses kinetic energy while traveling through the buffer layer 120 such that any interaction between the alpha particle 112 and the memory component, such as the latch 127, does not cause an error in the memory component. In another example, the buffer layer 120 and the insulating distance 121 prevent the alpha particle 112 from interacting with the memory layer 125 or the memory components (e.g., the SRAM 126 and the latch 127). The insulation from the radiation prevents soft errors in the package 100 without greatly increase the size needed for the memory components or the energy needed to power the electronics on the chips in the package 100.

While the buffer layer 120 prevents the radiation from the solder layer 110 from causing errors in the memory layer 125, electrical and other signals still need to be passed through the buffer layer. The semiconductor buffer layer 115 includes the electrical connection paths 116 (e.g., through silicon vias (TSVs)) which provide a path for electrical and/or other types of signals to pass from the solder layer 110 to the various other layers of the chip 150 including the memory layer 125 and the device layer 130.

As shown in FIG. 1, the buffer layer 120 includes both the semiconductor buffer layer 115 and the metal layer 122. In another example, the buffer layer 120 and the insulating distance 121 is provided completely by the semiconductor buffer layer 115. For example, the alpha particle 112 loses all or enough kinetic energy in the semiconductor buffer layer 115 to not affect memory components of the chip 150. In the example illustrated in FIG. 1, the metal layer 122 provides additional insulating distance to between the memory layer 125 and the solder layer 110. In some examples the buffer layer 120 may include multiple various layers of semiconductor layers as shown in FIG. 2.

Figure 2:
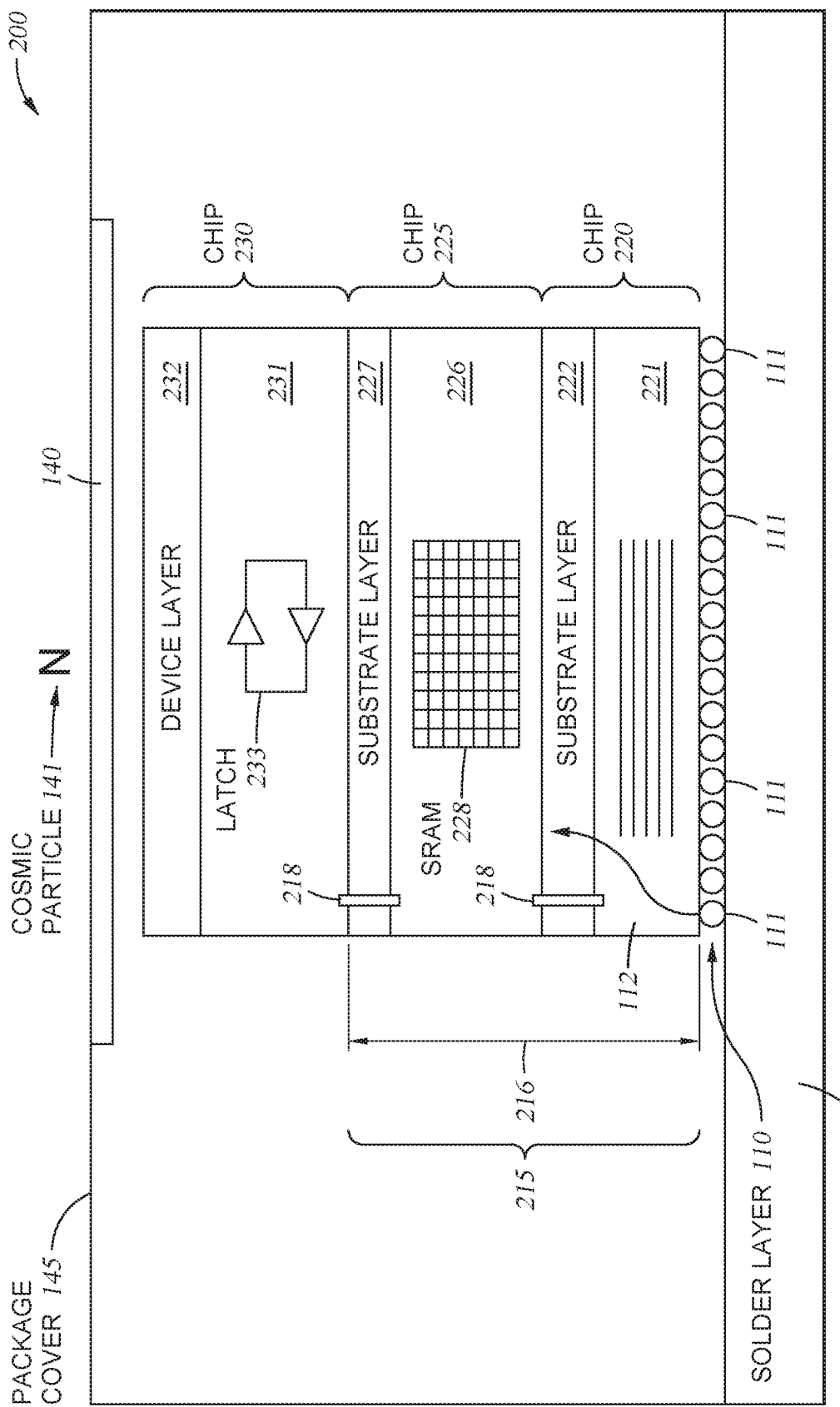
FIG. 2 illustrates an example integrated circuit package, according to one embodiment.

FIG. 2 illustrates an example integrated circuit package, package 200, according to one embodiment. For example the package 200 includes the package substrate 105 as described in relation to FIG. 1. The package 200 also includes the package cover 145 and the shield 140 integrated into the package cover 145 or disposed on the package cover 145, where the package cover 145 protects the various components in the package 200 from environmental conditions and contaminants that may disrupt the function of the package 200 and the shield 140 provides external radiation protection from sources of radiation that are external from the package 200.

The package 200 also includes multiple integrated circuit chips, chips 230, 225, and 220 where the chips 230, 225, and 220 are bonded to the package substrate 105 via the solder layer 110. The solder layer 110 includes one or more solder bumps 111 as described in relation to FIG. 1. The Alpha particle 112 may emit from any of the solder bumps 111 and can cause memory errors such as a soft error as described herein.

The chips 230, 225, and 220 may each provide a different function in the package 200. For example, the chip 220 provides an electrical or other type of signal connection to the package 200 from the package substrate 105 via a metal layer 221 and is formed from radiation resistant components. The chip 220 may also include a circuit layer including input/output driver circuits which are resistant to radiation. The chip 220 also includes a chip substrate layer such as a substrate layer 222 for bonding the chip 220 and the chip 225. The substrate layer 222 may be formed from semiconductor material and/or a silicon material. The various chip substrate layers described herein may be formed from a silicon material and provide for bonding the chips together. The chip 225 serves as chip including radiation resistant components, such as an ECC memory layer, and includes components such as a hardened SRAM 228 and/or other memory components (e.g., ECC protected memory) that are un-affected by sub-atomic particles and/or are less susceptible to memory errors caused by sub-atomic particles. For example, a soft error does not result when the alpha particle 112 interacts with the hardened SRAM 228. The chip 225 also includes a chip substrate layer, such as substrate layer 227 for bonding the chip 230 to the chip 225.

The chip 230 includes a component layer 231 which includes a latch 233 which requires protection from radiation such as the alpha particle 112. The chip 230 also includes a device layer 232 for the package 200. The component layer 231 may also include other memory components similar to the latch 233 and other types of memory storage, memory cells, electronic circuits, transistors, devices, other electronic components, and hardware which may require protection from sub-atomic particles.

In some examples, the bonding of the chips 220, 225, and 230 together is accomplished without using the substrate layers. To provide electrical and other signal connections between the bonded chips, the package 200 includes electrical connection paths 218 (e.g., TSVs) which provide paths for electrical and/or other types of signals to pass from the solder layer 110 to the various other chips, e.g., the chips 225 and 230 via the chip 220.

To prevent soft-errors and other potential disruption to the various components in the package 200 and at least sensitive memory components in the chip 230, the package 200 includes a buffer layer 215 disposed between the solder layer 110 and the component layer 231 in the chip 230. The buffer layer 215 provides an insulating distance 216 between the memory the component layer 231 and the solder layer 110, where the insulating distance 216 provides a sufficient distance between the solder layer 110 and at least the component layer 231 (or the memory components of the component layer 231) to prevent alpha particles (e.g., the alpha particle 112) emitted from the solder bumps 111 from interacting with and/or causing errors in the sensitive memory components (e.g., the latch 127). In some examples, the alpha particle 112 loses kinetic energy while traveling through the buffer layer 215 such that any interaction between the alpha particle 112 and the sensitive memory components, such as the latch 127, does not cause an error in the memory component. In another example, the buffer layer 215 and the insulating distance 216 prevent the alpha particle 112 from interacting and causing soft errors in the component layer 231 or the memory components (e.g., the latch 233).

The buffer layer 215 differs from the buffer layer 120 shown in FIG. 1, by using multiple chips 220 and 225 to provide the insulating distance between the component layer 231 and the solder layer 110 in the package 200. While shown in FIG. 2 with both the chip 220 and the chip 225 providing the insulating distance 216, multiple chips are not required to provide the buffer layer 215. For example, the chip 220 may alone provide the insulating distance 216. In some examples, the chip 220 and the chip 225 may be formed as a single chip and include both the metal layer 221 and the component layer 226. In some examples, the component layer 226 includes one or more electrical components that are not affected and/or are resistant to radioactive particles such as the alpha particle 112 which allows for the component layer 226 to provide at least a portion of the protective insulating distance 216.

Figure 3:
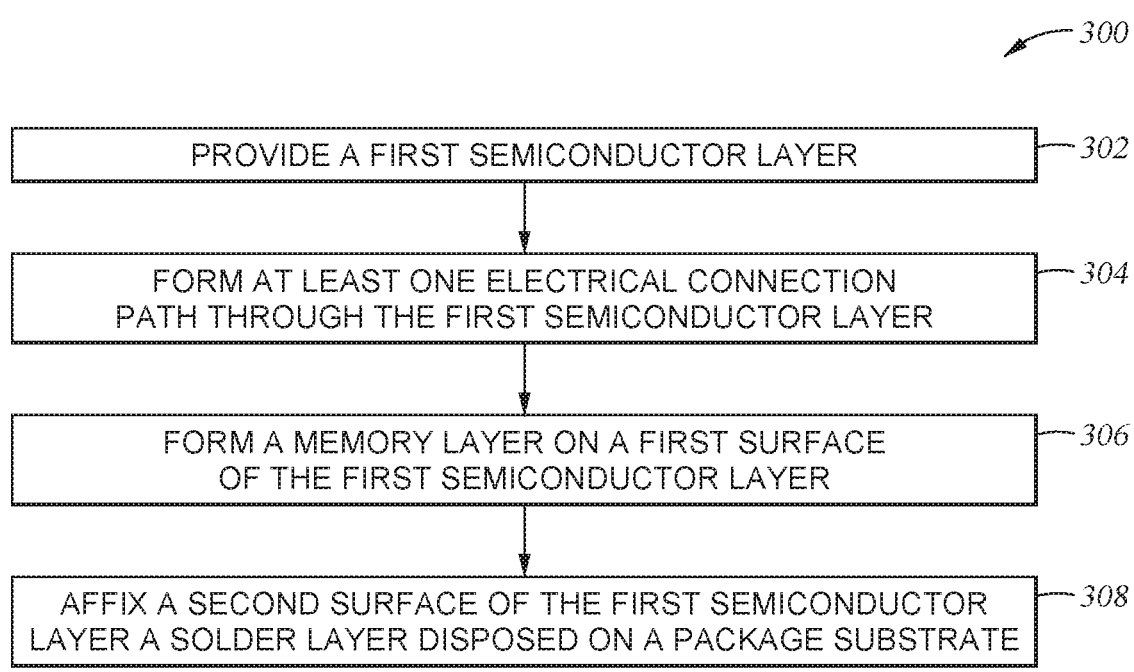
FIG. 3 illustrates an example method for manufacturing an integrated circuit package, according to one embodiment.

FIG. 3 illustrates an example method 300 for manufacturing an integrated circuit package, according to one embodiment. The method 300 may be performed by the system described in relation to FIG. 4, including a process engine 422, a manufacturing execution system (MES) 432, and manufacturing tools 440a-480c all described in greater detail in relation to FIG. 4. Method 300 begins at block 302 where the system 400 provides a first semiconductor layer. For example, the tools 440a-440c form the first semiconductor layer such as the buffer layer 120 (including at least semiconductor buffer layer 115). In some examples, the tools 440a-440c form the first semiconductor layer or buffer layer 120 using standard integrated circuit manufacturing techniques to form the semiconductor buffer layer 115 and the metal layer 122. In another example, the components or a portion of the components of the first semiconductor layer or buffer layer 120 are preformed and the tools 440a-440c gather or receive the preformed components in order to form the buffer layer 120. In another example, the tools 450a-450c provide/form the first semiconductor layer by forming or providing at least the chip 220 including the metal layer 221 and the substrate layer 222 and in some examples, the chip 225. In some examples, In some examples, the tools 440a-450d interact with the MES 432 to ensure that the first semiconductor layer provides the distance 121 or the insulating distance 216 and will provide radiation protection to any memory components in an integrated circuit package upon installation of the first semiconductor layer in a package. I At block 302, the system 400 forms at least one electrical connection path through the first semiconductor layer. For example, the tools 460a-460c may form the electrical connection paths 116 through the layer 115 as shown in FIG. 1. In some examples, the electrical connection paths may be formed in the semiconductor buffer layer 115 simultaneously during the formation of the semiconductor buffer layer 115. In another example, the electrical connection paths are formed after the semiconductor buffer layer 115 is formed or provided to the system 400. In another example, the tools 460a-c form the electrical connection paths 218 in the package 200 during joining of the chips, such as the chips 220-230 and/or after the chips are joined together.

At block 306 the system 400 forms a memory layer on a first surface of the first semiconductor layer, where at least one component in the memory layer is electrically connected to the at least one electrical connection path. For example, the tools 440a-440c form the memory layer 125 on a surface of the buffer layer 120. In another example, the tools 450a-450d form the component layer 231 on the chip 230 prior to bonding the chip 225 to the substrate layer 227 of the chip 225.

At block 308, the system 400 affixes a second surface of the first semiconductor layer a solder layer disposed on a package substrate, where the solder layer includes at least one radiation emitting component, and where the first semiconductor layer provides a radiation protection for the at least one component in the memory layer. For example, as shown in FIG. 1, the tools 470a-b using C4 or flip-chip process connect the chip 150 and/or the chip 220 to the package substrate 105 using the solder layer 110. IN some examples, the system 400 further processes the component of the integrate circuit package using the tools 480a-480a to complete the package into the package 100 or the package 200. For example, affixing the package cover 145 and/or shield 140, etc.

Figure 4:
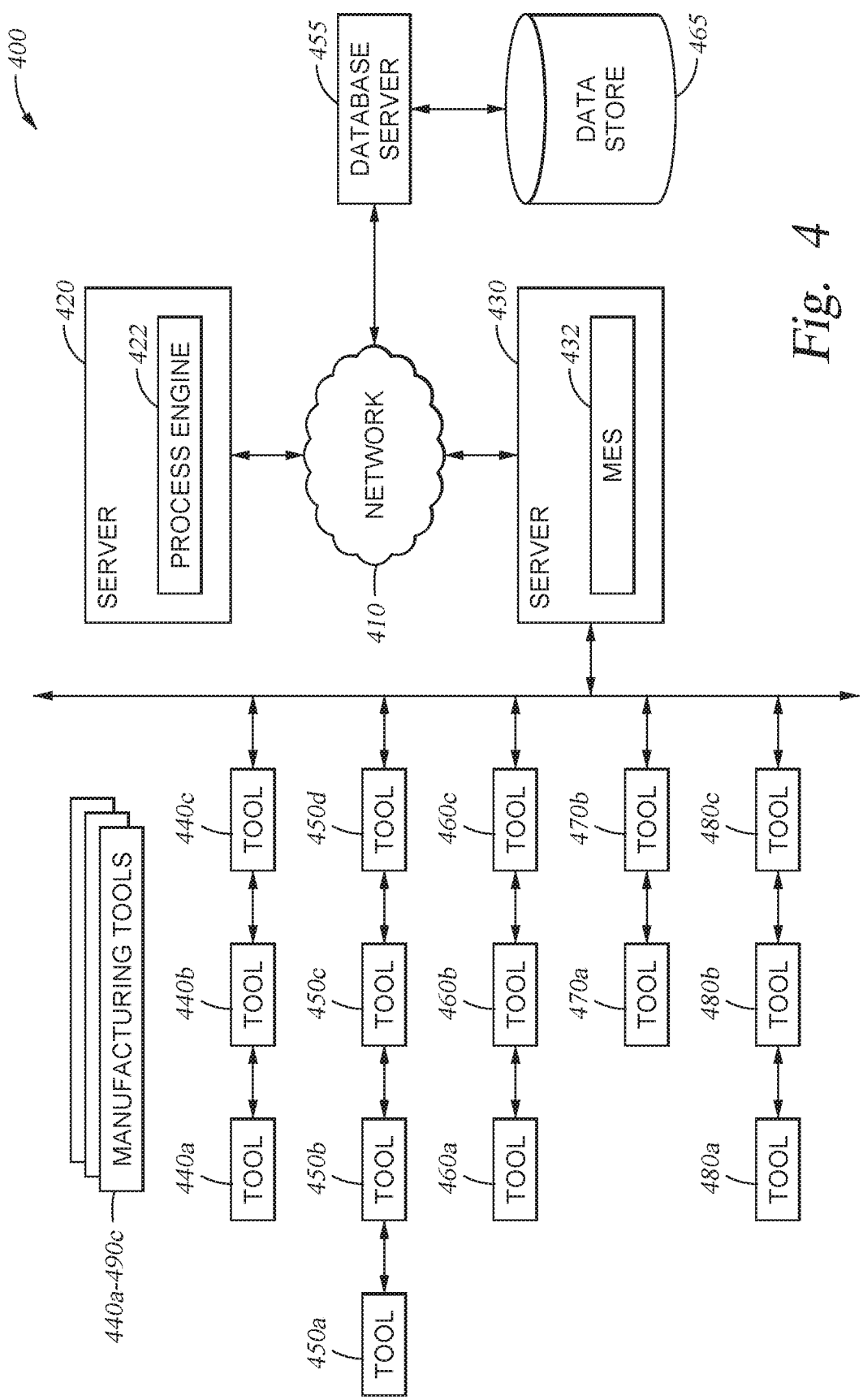
FIG. 4 depicts a manufacturing system in which embodiments of the present disclosure may be implemented.

FIG. 4 depicts a manufacturing system 400 in which embodiments of the present disclosure may be implemented. As shown, manufacturing system 400 includes a server 420 which is connected via network 410 to another server 430 which is connected to a plurality of manufacturing tools 440a-480c. Network 410 may, for example, comprise the Internet. In another embodiment, the manufacturing tools 440a-480c are also connected directly to server 420.

Server 420 may comprise a computing device such as a rack server, desktop or laptop computer, mobile phone, tablet, or other suitable computing device. As shown, the server 420 comprises a process engine 422 which may perform operations described herein related to employing the manufacturing tools 440a-480c perform a plurality of processing steps on each of substrate or chip which forms the integrated circuit packages described in relation to FIG. 1 and FIG. 2. For example, process engine 422 may analyze information received from the MES 432 of server 430 (e.g., chip design data, buffer data, defect data, information about the manufacturing process, information about the manufacturing tools, and metrology data) in order to direct one set of the manufacturing tools (e.g., 440a-450d) to perform the processing steps needed to manufacture the chips 150, 220, 225, and 230 as described above, to direct a second set of the manufacturing tools (e.g., 460a-470b) to perform the processing steps needed to manufacture to assemble the chips 150, 220, 225, and 230 together as discussed above, and to direct a third set of the manufacturing tools (e.g., 480a-480c) to perform the processing steps needed to bond the various chips 150, 220, 225, and 230 to the package substrate 105 using C4 bumps.

In some embodiments, the server 420 is separate from the manufacturing tools 440a-480c. In other embodiments, the server 420 may be part of the manufacturing tools 440a-480c or may be an off-line server.

Server 430 may comprise a computing device such as a rack server, desktop or laptop computer, mobile phone, tablet, or other suitable computing device. As shown, server 430 comprises the MES 432, which may perform operations described herein related to coordinate processes performed by the plurality of manufacturing tools 440a-480c, and may collect data from these tools (e.g., alignment data, chip design data, defect data, information about the manufacturing process, information about the parameters of the manufacturing tools 440a-480c, and metrology data). MES 432 may provide this information to process engine 422 (e.g., over network 410), which may analyze the information and provide instructions for controlling the processing steps to manufacture the 3D integrated circuit.

Manufacturing tools 440a-480c may comprise one or more tools which perform processes related to manufacturing components such as chips 150, 220, 225, and 230. For example, manufacturing tools 440a-480c may include lithography tools (e.g., including mechanical and optical alignment tools), etching tools, deposition tools, and planarization tools. Manufacturing tools 440a-480c may communicate with MES 432 in order to receive instructions and provide information about, for example, chips, positioning, substrates, defects, parameters, and the manufacturing process.

The manufacturing system 400 is adapted to fabricate semiconductor devices. Although the subject matter is described as it may be implemented in a semiconductor fabrication facility, the application of the techniques described herein is not so limited and may be applied to other manufacturing environments. The techniques described herein may be applied to a variety of manufactured items including, but not limited to microprocessors, memory devices, digital signal processors, application specific integrated circuits (ASICs), or other similar devices. The techniques may also be applied to manufactured items other than semiconductor devices.

Each of the manufacturing tools 440a-480c are grouped into sets of tools of the same type, as denoted by lettered suffixes. For example, the set of manufacturing tools 440a-480c represent tools of a certain type, such as a photolithography stepper that are capable of performing the same process operation. In the case of manufacturing tools 440a-480c with multiple chambers, the lettered suffixes may represent multiple chambers of a single process tool. A particular substrate or lot of substrates progresses through the manufacturing tools 440a-480c as it is being manufactured, with each of the manufacturing tools 440a-480c performing a specific function in the process flow. Exemplary manufacturing tools for a semiconductor device fabrication environment, include metrology tools, photolithography steppers, etch tools, deposition tools, polishing tools, rapid thermal process tools, implantation tools, test equipment tools, etc. The manufacturing tools 440a-480c are illustrated in a rank and file grouping for illustrative purposes only. In an actual implementation, the manufacturing tools 440a-480c may be arranged in any order of grouping. Additionally, the connections between the tools in a particular grouping are meant to represent only connections to the network 410, rather than interconnections between the tools.

Although the manufacturing system 400 is described as it may be implemented for scheduling lots of manufactured items, it may also be used schedule individual manufactured items. The MES 432 of server 430 directs the high level operation of the manufacturing system 400. The MES 432 monitors the status of the various entities in the manufacturing system 400 (i.e., lots, the manufacturing tools 440a-480c and controls the flow of articles of manufacture (e.g., lots of semiconductor substrates) through the process flow. The MES 432 may also be referred to as a scheduling server. A database server 455 is provided for storing data related to the status of the various entities and articles of manufacture in the process flow. The database server 455 may store information in a data store 465. The data may include pre-process and post-process metrology data, tool trace data, lot priorities, etc. The distribution of the processing and data storage functions amongst the different servers in FIG. 4 is generally conducted to provide independence and central information storage. Of course, different numbers of servers and different arrangements may be used.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

What is claimed is:

1. An integrated circuit package comprising:
    a solder layer disposed on a package substrate, wherein the solder layer comprises at least one radiation emitting component;
    a semiconductor buffer layer disposed on the solder layer, wherein the semiconductor buffer layer comprises at least one electrical connection path formed in the semiconductor buffer layer; and
    a memory layer disposed on the semiconductor buffer layer, wherein the memory layer comprises at least one memory component, wherein the semiconductor buffer layer provides radiation protection for the at least one memory component.

2. The integrated circuit package of claim 1, wherein the at least one radiation emitting component comprises:
    a plurality of solder bumps bonded to the semiconductor buffer layer, wherein the plurality of solder bumps emit alpha particle radiation.

3. The integrated circuit package of claim 1, wherein the integrated circuit package further comprises
    a metal layer disposed between the semiconductor buffer layer and the memory layer.

4. The integrated circuit package of claim 3, wherein the semiconductor buffer layer comprises a silicon material,
    wherein, the at least one electrical connection path comprises a plurality of through silicon vias (TSVs) formed in the silicon material, and
    wherein the plurality of TSVs provide an electrical connection from the solder layer to the metal layer.

5. The integrated circuit package of claim 4, wherein the semiconductor buffer layer and the metal layer provide a protective distance between the at least one radiation emitting component and the at least one memory component in the memory layer wherein the protective distance provides the radiation protection.

6. The integrated circuit package of claim 5, wherein the protective distance is at least 50 micrometers.

7. The integrated circuit package of claim 1, wherein the semiconductor buffer layer further comprises:
    one or more integrated circuit chips comprising radiation resistant components.

8. The integrated circuit package of claim 7, further comprising a plurality of through silicon vias (TSVs) formed in a substrate layer of the one or more integrated circuit chips, and
    wherein the plurality of TSVs provide an electrical connection from the solder layer to the memory layer.

9. The integrated circuit package of claim 8, wherein the one or more integrated circuit chips comprises a first integrated circuit chip comprising:
    a first chip surface disposed on the solder layer;
    a circuit layer disposed on the first chip surface comprising at least one of a input/output driver circuit; and
    a first chip substrate layer disposed on the circuit layer, wherein at least one TSV of the plurality of TSVs is formed in the first chip substrate layer, where the at least one TSV formed in the first chip substrate layer provides electrical and signal connections from the circuit layer to a second integrated circuit chip of the one or more integrated circuit chips, wherein the second integrated circuit chip is disposed on the first chip substrate layer.

10. The integrated circuit package of claim 9, wherein the second integrated circuit chip comprises:

an error-correcting code (ECC) memory layer disposed on the first chip substrate layer comprising at least one of a ECC memory data storage and hardened memory data storage; and a second chip substrate layer disposed on the ECC memory layer, wherein at least one TSV of the plurality of TSVs is formed in the second chip substrate layer, where the at least one TSV formed in the second chip substrate layer provides electrical and signal connections from the ECC memory layer to the memory layer, wherein the memory layer is disposed on the second chip substrate layer.

11. The integrated circuit package of claim 8, wherein one or more integrated circuit chips provide a protective distance between the at least one radiation emitting component and at least one memory component in the memory layer wherein the protective distance provides the radiation protection for the memory layer.

12. A radiation buffer for an integrated circuit package comprising:

a semiconductor buffer disposed between a radiation emitting component of an integrated circuit package and a radiation sensitive component of an integrated circuit package, wherein the semiconductor buffer comprises at least one electrical connection path formed in the semiconductor buffer, wherein the at least one electrical connection path provides an electrical connection between the radiation emitting component and the radiation sensitive component.

13. The radiation buffer of claim 12, wherein the radiation emitting component comprises:

a plurality of solder bumps connected to the semiconductor buffer, wherein the plurality of solder bumps emit alpha particle radiation.

14. The radiation buffer of claim 12, wherein the semiconductor buffer further comprises:

a semiconductor material disposed adjacent to the radiation emitting component; and wherein the radiation buffer further comprises a metal layer disposed between the semiconductor material and the radiation sensitive component.

15. The radiation buffer of claim 14, wherein the semiconductor buffer comprises a silicon material, wherein, the at least one electrical connection path comprises a plurality of through silicon vias (TSVs) formed in the silicon material, and wherein the plurality of TSVs provide an electrical connection from the radiation emitting component to the metal layer.

16. The radiation buffer of claim 15, wherein the semiconductor material and the metal layer provide a protective distance between the radiation emitting component and radiation sensitive component.

17. The radiation buffer of claim 12, wherein the radiation buffer further comprises:

one or more integrated circuit chips comprising radiation resistant components.

18. A method for manufacturing an integrated circuit package with radiation protection, comprising:

providing a first semiconductor layer;

forming at least one electrical connection path through the first semiconductor layer;

forming a memory layer on a first surface of the first semiconductor layer, wherein at least one component in the memory layer is electrically connected to the at least one electrical connection path; and affixing a second surface of the first semiconductor layer to a solder layer disposed on a package substrate, wherein the solder layer comprises at least one radiation emitting component, and wherein the first semiconductor layer provides a radiation protection for the at least one component in the memory layer.

19. The method of claim 18, wherein the first semiconductor layer comprises a silicon material, wherein, the at least one electrical connection path comprises a plurality of through silicon vias (TSVs) formed in the silicon material, and wherein the plurality of TSVs provide an electrical connection from the solder layer to memory layer.

20. The method of claim 18, wherein the first semiconductor layer further comprises:

one or more integrated circuit chips comprising radiation resistant components, wherein, the at least one electrical connection path comprises a plurality of through silicon vias (TSVs) formed in a substrate layer of the one or more integrated circuit chips, and wherein the plurality of TSVs provide an electrical connection from the solder layer to the memory layer.

* * * * *